(12) United States Patent  
Johnson et al.

(10) Patent No.: US 6,553,280 B2
(45) Date of Patent: Apr. 22, 2003

(54) VALVE/SENSOR ASSEMBLIES

(75) Inventors: Brian Johnson, Palo Alto, CA (US); Edward Ng, San Jose, CA (US); Justin Mauck, Fort Collins, CO (US); Edward R. Dykes, San Jose, CA (US); Joseph Arthur Kraus, Austin, TX (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/895,437

(22) Filed: Jun. 30, 2001

(65) Prior Publication Data

US 2002/0081177 A1 Jun. 27, 2002

Related U.S. Application Data

(60) Provisional application No. 60/216,981, filed on Jul. 7, 2000.

(51) Int. Cl.$^7$ ................................................ G05B 15/00

(52) U.S. Cl. ...................... 700/258; 700/218; 700/213; 414/935; 414/936; 414/939

(58) Field of Search ................................. 700/213, 214, 700/218, 295, 258, 259; 414/935, 936, 937, 939, 941

(56) References Cited

U.S. PATENT DOCUMENTS

| | | | | |
|---|---|---|---|---|
| 4,819,167 A | * | 4/1989 | Cheng et al. | 700/59 |
| 5,563,798 A | * | 10/1996 | Berken et al. | 700/218 |
| 5,934,856 A | * | 8/1999 | Asakawa et al. | 414/217 |
| 5,980,194 A | * | 11/1999 | Freerks et al. | 414/754 |
| 6,075,334 A | * | 6/2000 | Sagues et al. | 318/568.11 |
| 6,190,037 B1 | * | 2/2001 | Das et al. | 374/121 |
| 6,287,386 B1 | * | 9/2001 | Perlov et al. | 118/719 |
| 6,315,512 B1 | * | 11/2001 | Tabrizi et al. | 414/217 |
| 6,339,730 B1 | * | 1/2002 | Matsushima | 700/218 |
| 6,347,918 B1 | * | 2/2002 | Blahnik | 414/217 |
| 6,413,356 B1 | * | 7/2002 | Chokshi et al. | 414/937 |

* cited by examiner

Primary Examiner—Khoi H. Tran
(74) Attorney, Agent, or Firm—Dugan & Dugan

(57) ABSTRACT

In a first aspect, a valve/sensor assembly is provided that includes a door assembly. The door assembly has (1) a first position adapted to seal an opening of a chamber; (2) a second position adapted to allow at least a blade of a substrate handler to extend through the opening of the chamber; and (3) a mounting mechanism adapted to couple the door assembly to the chamber. The valve/sensor assembly also includes a sensor system having a transmitter and a receiver adapted to detect a presence of a substrate and to communicate through at least a portion of the door assembly. Systems, methods and computer program products are provided in accordance with this and other aspects.

21 Claims, 17 Drawing Sheets

VALVE/SENSOR ASSEMBLIES

The present application claims priority from U.S. Provisional Patent Application Ser. No. 60/216,981, filed Jul. 7, 2000, which is hereby incorporated by reference herein in its entirety.

FIELD OF THE INVENTION

The present invention relates to detection technology, and more specifically to detection technology that is used to detect a semiconductor wafer.

BACKGROUND OF THE INVENTION

Semiconductor wafers are processed within automated fabrication tools comprising a plurality of chambers. FIG. 1A is a schematic top plan view, in pertinent part, of an automated semiconductor device fabrication tool 11. The exemplary fabrication tool 11 of FIG. 1A comprises a first transfer chamber 13 and a second transfer chamber 15. A first and a second wafer handler 17, 19, each having a blade (not shown) that may support a wafer, are housed in the first transfer chamber 13 and the second transfer chamber 15, respectively. The first transfer chamber 13 and the second transfer chamber 15 are both monolithic and have various chambers coupled thereto.

A pair of loadlocks 21, 23 and a pair of pass-through chambers 25, 27 are coupled to the first transfer chamber 13. Other chambers such as degassing or oxide-etch chambers (shown in phantom) also may be coupled to the first transfer chamber 13. The pass-through chambers 25, 27 and a plurality of processing chambers 29, 31, 33, and 35, which are configured to perform various semiconductor device fabrication processes (e.g., chemical vapor deposition, sputter deposition, etc.), are coupled to the second transfer chamber 15. A controller 36 controls wafer transfer and processing within the fabrication tool 11.

Typically the environment of each chamber must be selectively isolated from the environments of neighboring chambers to prevent cross contamination, and to enable the various chambers to be maintained at pressures that differ according to the process to be performed therein. To achieve such selective isolation, each chamber is provided with a slit (not shown) through which one of the wafer handlers 17, 19 may extend to transport wafers to and from the chamber. The slit of each chamber is selectively sealed with a door assembly 37 (typically referred to as a slit valve for vacuum applications, and as a gate valve for non-vacuum applications).

As the wafer handlers 17, 19 transport a wafer through slits and through various chambers, the wafer must be accurately positioned on the blade of each wafer handler 17, 19 to avoid breaking or damaging the wafer (by the wafer falling or striking a chamber component), to ensure proper placement of the wafer on a wafer pedestal so as to prevent deposition of material on the wafer pedestal during processing and to ensure complete coverage during deposition of a material layer on the wafer, etc. Accordingly, to ensure accurate wafer positioning (so as to avoid wafer damage/breakage or deposition on a wafer pedestal, so as to ensure complete material layer coverage on a wafer, etc.), numerous wafer detection devices (e.g., sensor systems) exist in fabrication tools to determine a wafer's position. Such sensor systems are typically located in the transfer chambers 13, 15, although sensor systems may be located in other chambers as well. A fabrication tool may employ multiple sensor systems.

Two main types of sensor systems are conventionally used within fabrication tools. Both systems employ sensors to detect a wafer's position as the wafer enters and/or leaves a chamber. In the first system, a sensor is mounted to the outside of a processing chamber and monitors wafer position via a quartz window formed in the processing chamber. That is, a wafer is observed through the quartz window as the wafer enters and exits the processing chamber. In the second system, a sensor is mounted within a transfer chamber and monitors a wafer's position as the wafer enters and exits the transfer chamber. The two conventional sensor systems may be used individually or jointly in the fabrication tool 11.

Both types of sensor systems have disadvantages. With regard to the first sensor system, material may deposit on the quartz window during processing and affect sensor resolution/accuracy. With regard to the second system, sensor mounting locations typically must be machined within the transfer chamber (e.g., a potentially difficult and time consuming process).

FIG. 1B is a partially exploded perspective view of the transfer chamber 15 of FIG. 1A that is useful in explaining another conventional sensor system. The transfer chamber 13 of FIG. 1A may be similarly configured.

As stated, in one conventional sensor system, a sensor may be mounted within a transfer chamber and monitor a wafer's position as the wafer enters and exits the transfer chamber. For example, in FIG. 1B, a plurality of light transmitters 39a–b (shown in phantom) are mounted to a lid 41 of the transfer chamber 15 (e.g., to one or more quartz windows or viewports not shown) and generate light beams 44a–b (shown in phantom) that are directed toward a bottom 43 of the transfer chamber 15. A plurality of receivers 45a–b (e.g., photodetectors) are mounted to the bottom 43 of the transfer chamber 15 (e.g., the bottom 43 is machined to accept the receivers 45a–b), and are positioned to receive the light beams 44a–b generated by the transmitters 39a–b.

By monitoring when the light beams 44a–b are broken by a wafer W positioned on a blade B (shown in phantom) of the wafer handler 19 (e.g., as the wafer W is positioned for entry through a slit 47 of the transfer chamber 15 and/or as the wafer W travels through the slit 47 of the transfer chamber 15), the position of the wafer W on the blade B may be determined by conventional techniques.

A reflection based system wherein light beams 44a–b are reflected off of the wafer W toward the receivers 45a–b also may be employed to determine wafer position (e.g., if both the transmitters 39a–b and the receivers 45a–b are mounted to either the lid 41 or the bottom 43). In either case, machining of one or more of the lid 41 and the bottom 43 may be required.

In one conventional system termed an on-the-fly (OTF) center finder, the transmitters 39a–b and the receivers 45a–b are employed to sense the wafer W as the wafer handler 19 rotates, and to determine wafer center information based thereon. Typically three light transmitters and three receivers are employed. The three light transmitters conventionally are mounted to the bottom 43 of the transfer chamber 15, outside the transfer chamber 15. Holes are machined in the bottom 43 to allow the light beams from the transmitters to travel into the transfer chamber 15. The three receivers typically are mounted to the lid 41, outside the transfer chamber 15. Holes are machined in the lid 41 to allow the light beams from the transmitters to travel to the receivers.

In operation, the OTF center finder monitors (via the receivers mounted to the lid 41 of the transfer chamber 15) when light beams emitted by the transmitters mounted to the bottom 43 of the transfer chamber 15 are blocked by the wafer W (e.g., as during such time periods, no light beams are detected by the receivers mounted to the lid 41). A corresponding "blocked" light beam signal is sent to a controller (not shown), and the controller determines a step count of a motor (not shown) that rotates the wafer handler 19. The controller then employs an algorithm to determine the center of the wafer W in relation to the center of the wafer handler 19. The wafer W thereby may be placed in an exact location as it travels through the slit 47.

As well as requiring machining of holes in the transfer chamber 15, the OTF center finder suffers from other drawbacks. For example, the wafer W may move on the blade B during rotation (after passing the light beams 44a–b). Wafer position determinations thereby may be inaccurate.

Accordingly, an improved method and apparatus is needed for detecting wafer position during wafer transfer.

SUMMARY OF THE INVENTION

In accordance with a first aspect of the invention, a valve/sensor assembly is provided that includes a door assembly. The door assembly has (1) a first position adapted to seal an opening of a chamber; (2) a second position adapted to allow at least a blade of a substrate handler to extend through the opening of the chamber; and (3) a mounting mechanism adapted to couple the door assembly to the chamber. The valve/sensor assembly also includes a sensor system having a transmitter and a receiver adapted to detect a presence of a substrate and to communicate through at least a portion of the door assembly.

In a second aspect of the invention, a valve/sensor assembly is provided that includes a door assembly having (1) a first position adapted to seal an opening of a chamber; (2) a second position adapted to allow at least a blade of a substrate handler to extend through the opening of the chamber; and (3) a mounting mechanism adapted to couple the door assembly to the chamber, the mounting mechanism having a viewport. The valve/sensor assembly also includes a sensor system having a transmitter and a receiver adapted to detect a presence of a substrate and to communicate through the viewport of the mounting mechanism.

Systems, methods and computer program products are provided in accordance with these and other aspects of the invention. Each computer program product may comprise a medium readable by a computer (e.g., a carrier wave signal, a floppy disk, a compact disk, a hard drive, etc.).

Other features and aspects of the present invention will become more fully apparent from the following detailed description, the appended claims and the accompanying drawings.

DETAILED DESCRIPTION

Figure 1A:
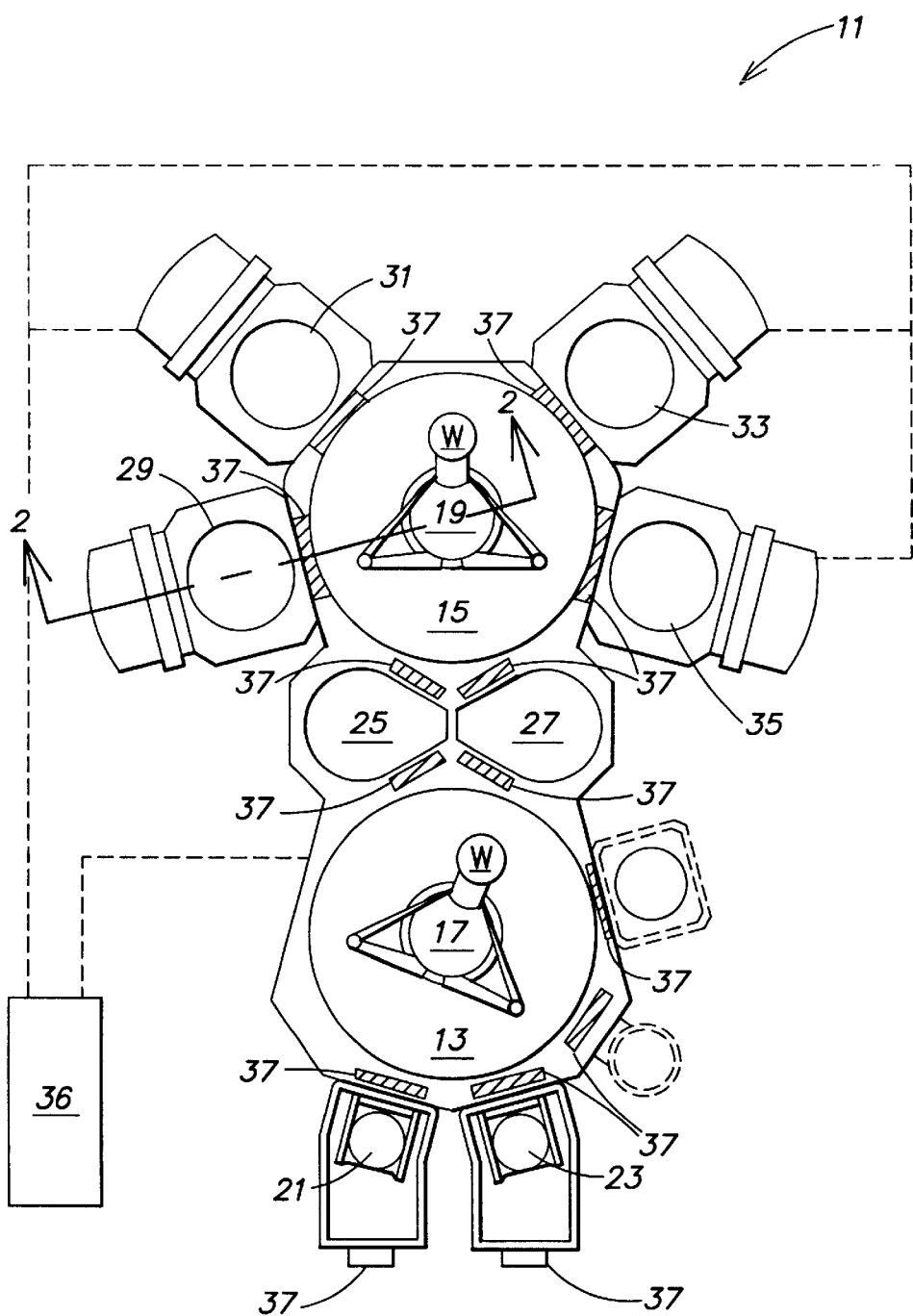
FIG. 1A is a schematic top plan view, in pertinent part, of a conventional automated semiconductor device fabrication tool.
Figure 1B:
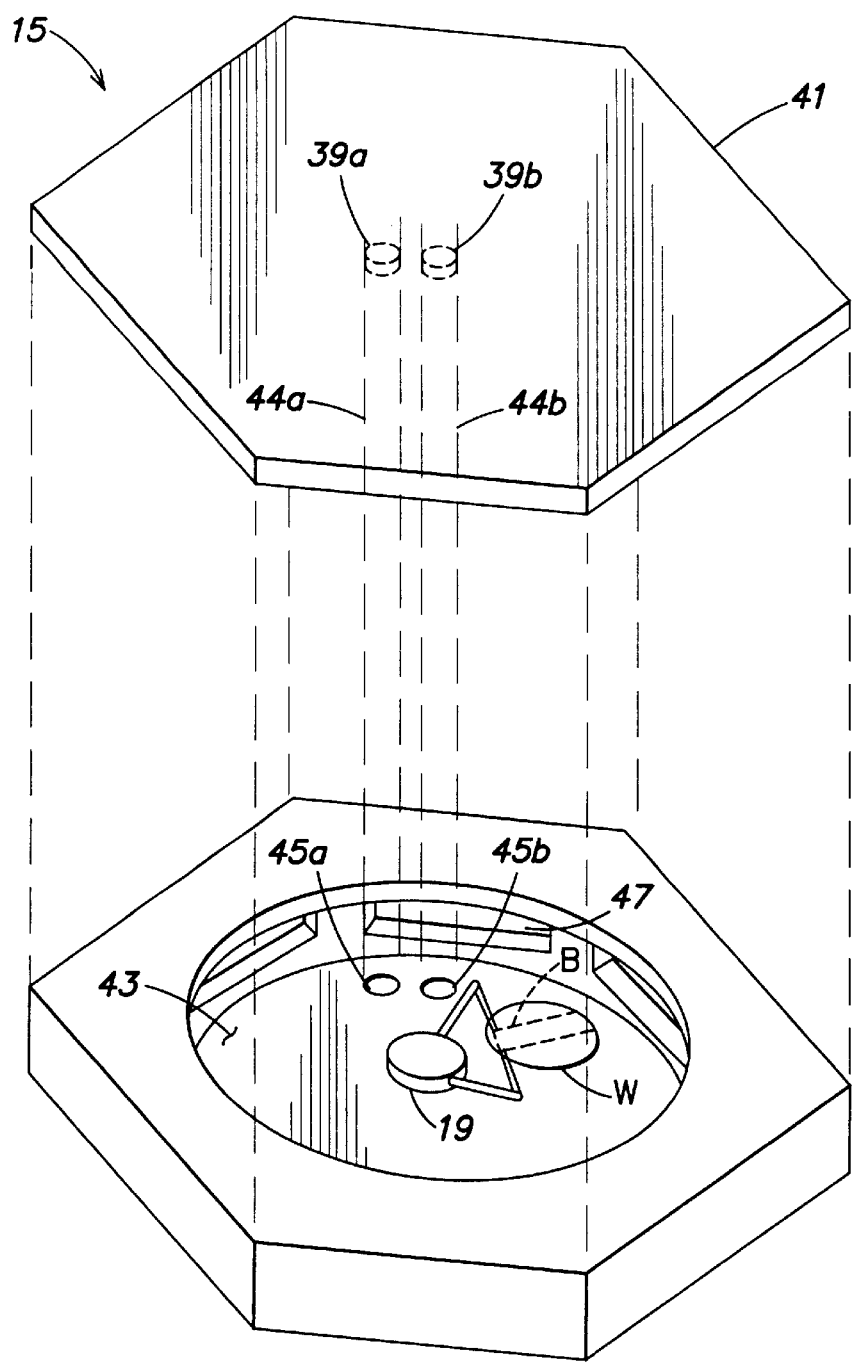
FIG. 1B is a partially exploded perspective view of the transfer chamber of FIG. 1A that is useful in explaining conventional sensor systems.

In accordance with the present invention, a novel sensor system is provided wherein sensors (e.g., transmitters and/or receivers) employed during conventional wafer position and/or center determinations are attached to and/or may communicate through a door assembly (e.g., a slit valve bracket) employed to seal an opening of a transfer chamber (e.g., the slit 47 of FIG. 1B). In this manner, additional holes or sensor mounting locations need not be machined within the transfer chamber (e.g., within the bottom 43 of the transfer chamber 15 of FIG. 1B). Sensors may be positioned such that a light beam is broken by a wafer just before the wafer exits the transfer chamber (e.g., as the wafer enters the slit 47 and travels to a processing chamber such as one of the processing chambers 29–35 of FIG. 1A). In this manner, as compared to an OTF center finder, a wafer is significantly less likely to move (e.g., relative to a wafer handler blade that supports the wafer) after the wafer passes the sensors or exits the transfer chamber. Additionally, controller software employed during wafer positioning calculations is simplified because sensors may be positioned so that only wafers exiting the transfer chamber may break the light beams of the sensors (e.g., other wafers being transported between processing chambers, or portions of a wafer handler cannot inadvertently break the light beam of a sensor). Only one sensor bank per transfer chamber opening is required.

As stated, the inventive sensor system employs sensors attached to a door assembly that seals an opening of a transfer chamber. In general, any type of door assembly may be so configured (e.g., gate valve assemblies, slit valve assemblies, etc.). Several exemplary door assemblies configured in accordance with the present invention are described below. It will be understood that other door assemblies may be similarly configured.

Conventional Angled Door Assembly

Figure 2:
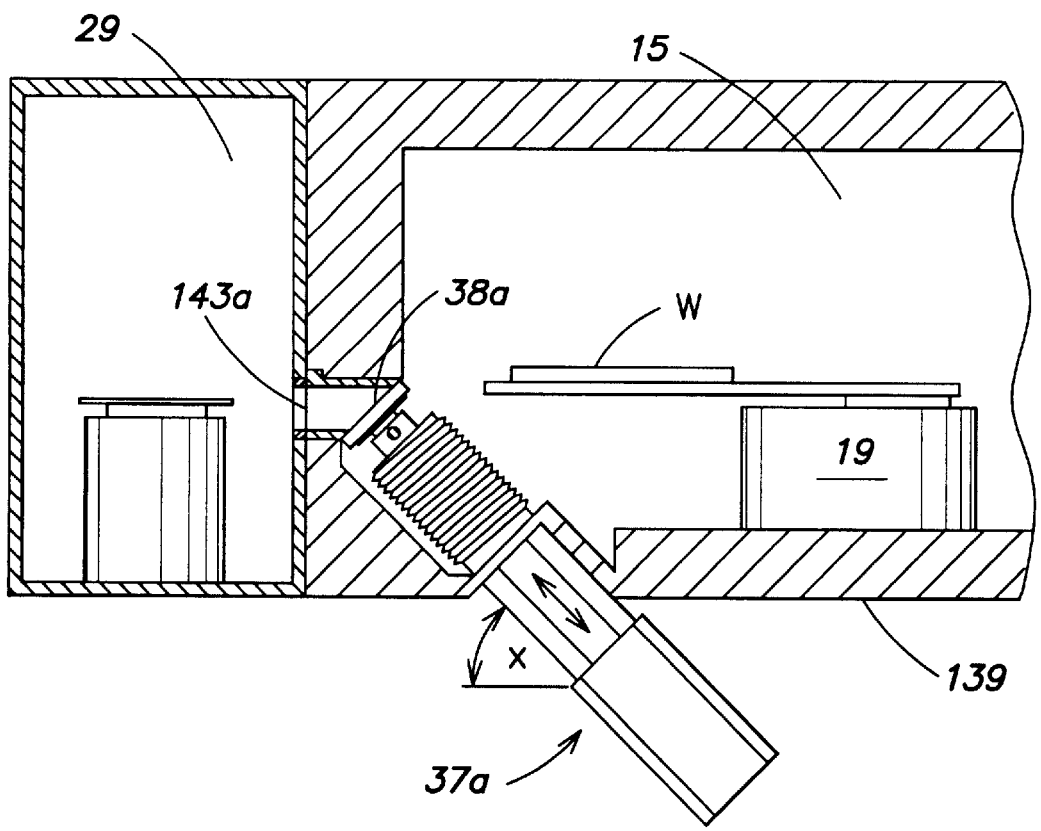
FIG. 2 is a partial sectional view of the fabrication tool of FIG. 1A taken along the line 2—2 of FIG. 1A, which shows an angled door assembly.

FIG. 2 is a partial sectional view of the fabrication tool 11 of FIG. 1A taken along the line 2—2 of FIG. 1A, which shows an angled door assembly 37a. The angled door assembly 37a includes a sealing surface 38a that typically moves up and down at a 45 degree angle (shown by angle X in FIG. 2) relative to a bottom wall 139 of the transfer chamber 15 so as to selectively engage and seal a sealable opening 143a (e.g., a slit) of the transfer chamber 15 as shown in FIG. 2.

Figure 3A:
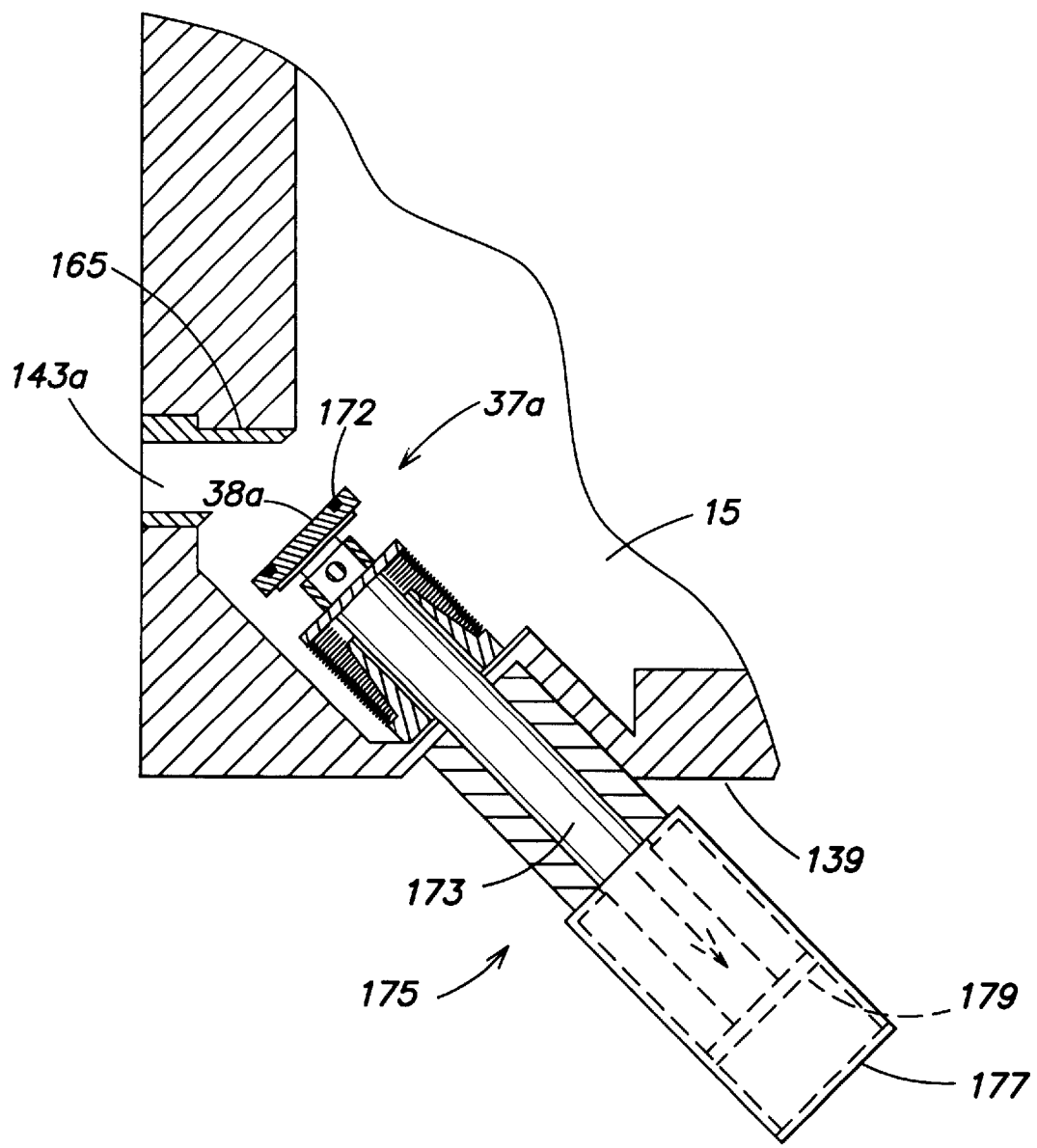
FIGS. 3A–B are side views of the angled door assembly of FIG. 2 in an opened and closed position, respectively.
Figure 3B:
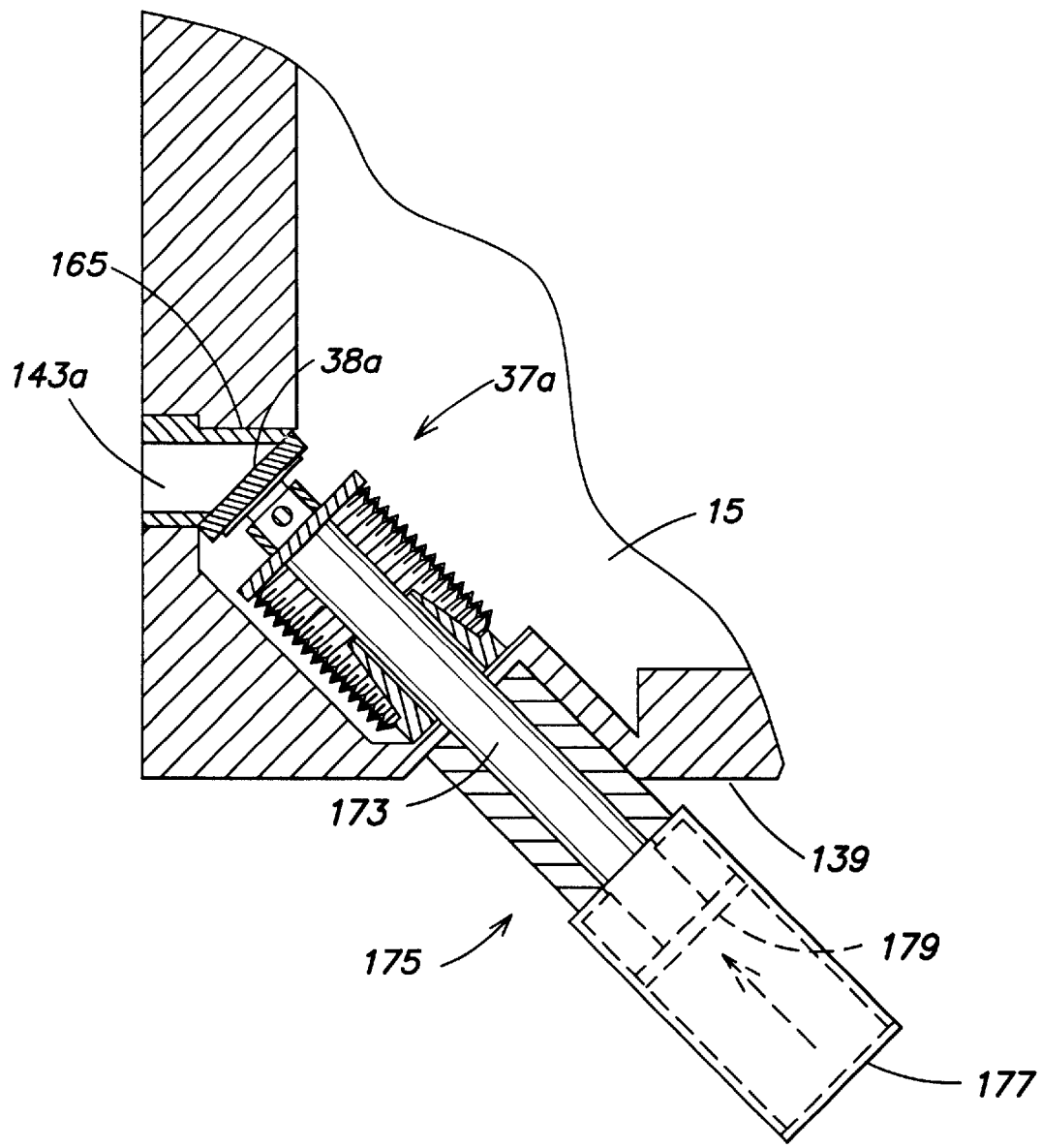

FIGS. 3A–B are side views of the angled door assembly 37a of FIG. 2 in an opened and closed position, respectively, and illustrate the angled door assembly 37a in more detail than that shown in FIG. 2. The sealing surface 38a of the angled door assembly 37a moves between the opened position (FIG. 3A) wherein the angled door assembly 37a does not seal the opening 143a and the closed position (FIG. 3B) wherein the angled door assembly 37a seals the opening 143a.

As shown in FIGS. 3A–B, the opening 143a is surrounded by a valve seat 165, whereby the sealing surface 38a of the angled door assembly 37a selectively engages the valve seat 165 to close the opening 143a. The sealing surface 38a of the angled door assembly 37a may have a groove (not shown) formed therein to contain an O-ring 172. The sealing surface 38a is positioned to contact the valve seat 165 when the angled door assembly 37a is in a closed position (FIG. 3B).

The angled door assembly 37a also may comprise an elongated shaft portion 173 (of an actuator assembly 175) that allows the angled door assembly 37a to move between the opened position (FIG. 3A) and the closed position (FIG. 3B). The actuator assembly 175 may comprise a cylinder 177 that has a piston 179 that drives the shaft port 173 (and the sealing surface 38a coupled thereto) between the opened and closed positions. The angled door assembly 37a may be configured, for example, as described in U.S. Pat. No. 5,363,872, issued Nov. 15, 1994, the entire disclosure of which is incorporated herein by this reference.

In operation, the wafer handler 19 (FIG. 1A or FIG. 1B) transfers the wafer W toward the sealable opening 143a (e.g., slit 47 in FIG. 1B). As the wafer handler 19 approaches the sealable opening 143a, the sealing surface 38a of the angled door assembly 37a, upon actuation, moves to the opened position (FIG. 3A) so as to allow the blade of the wafer handler 19 to extend through the opening 143a. The wafer W then may be transferred to another chamber via the blade of the wafer handler 19.

First Inventive Valve/Sensor Assembly

Figure 4:
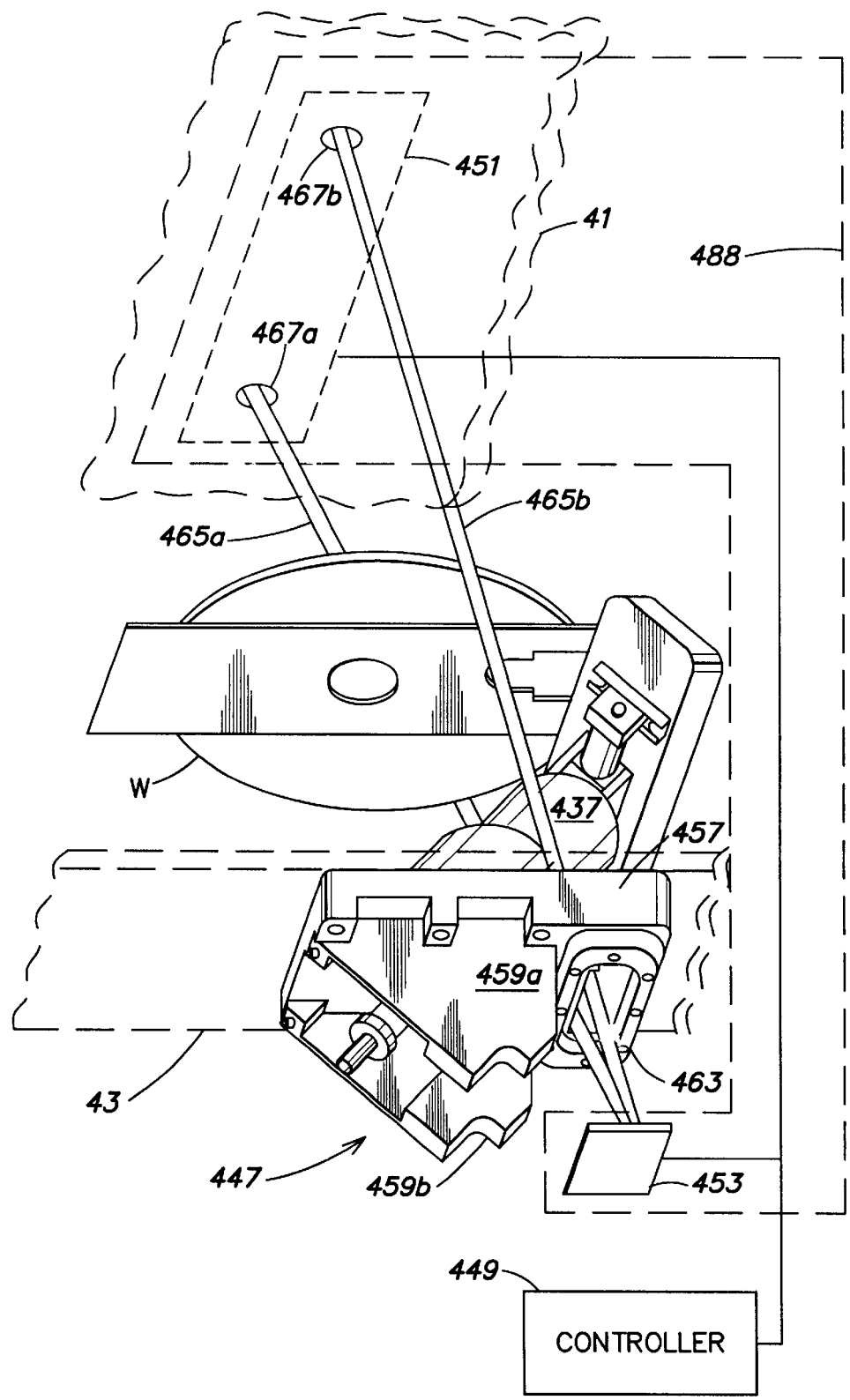
FIG. 4 is a perspective view of a first inventive valve/sensor assembly that employs an angled door assembly that is similar to the angled door assembly of FIGS. 2–3B.

FIG. 4 is a perspective view of a first inventive valve/sensor assembly 445 that employs an angled door assembly 437 that is similar to the angled door assembly 37a of FIGS. 2–3B. The inventive valve/sensor assembly 445 may detect the position of a wafer within a chamber such as one of the transfer chambers 13, 15 of FIG. 1A.

With reference to FIG. 4, the inventive valve/sensor assembly 445 includes a mounting mechanism 447 for mounting the angled door assembly 437 to a bottom of a transfer chamber (e.g., to the bottom 43 of the transfer chamber 15 of FIG. 1B), a sensor system 448 and a controller 449 coupled to the sensor system 448. The angled door assembly 437 may be positioned so as to seal one of the various slits of the transfer chamber 15, such as slit 47 in FIG. 1B as described previously with reference to the door assembly 37a of FIGS. 2–3B.

The sensor system 448 may detect the position of a wafer and may output a signal indicative of the position of the wafer by using one or more conventional techniques. The controller 449 may receive the signal output by the sensor system 448. In the exemplary embodiment of FIG. 4, the sensor system 448 includes a light transmitter 451, such as one or more light emitting diodes (LEDs), and a receiver 453, such as one or more photodetectors.

In one embodiment, the mounting mechanism 447 is configured to couple to the bottom wall 43 (shown in phantom in FIG. 4) of the transfer chamber 15, via bolts or some other fastener (not shown). The mounting mechanism 447 may comprise a bracket that includes a horizontal mounting platform 457 adapted to couple to the bottom wall 43 of the transfer chamber 15, and two vertical sidewalls 459a, 459b coupled to the horizontal mounting platform 457. The mounting platform 457 and the sidewalls 459a, 459b may be machined from a single piece of material (if desired). Any other configuration may be similarly employed.

The horizontal mounting platform 457 comprises an opening (not shown) in which the angled door assembly 437 is mounted, and a viewport 463. In one or more embodiments of the invention, the viewport 463 allows the light transmitter 451 and the receiver 453 to communicate as described below. The viewport 463 may comprise, for example, a quartz window that allows a light beam to travel therethrough, and the light transmitter 451 and/or the receiver 453 to be isolated from the environment of the transfer chamber 15.

In the embodiment of FIG. 4, the light transmitter 451 is coupled to the lid 41 of the transfer chamber 15 (e.g., is mounted to the lid 41 outside the transfer chamber 15), and generates a plurality of light beams 465a–b which travel through the lid 41 (e.g., through a plurality of holes 467a–b in the lid 41, or one or more quartz windows or viewports (not shown) of the lid 41) into the transfer chamber 15 toward the viewport 463. When not obstructed by the wafer W, the light beams travel through the viewport 463 and are detected by the receiver 453.

The receiver 453, for example, may be coupled to the mounting mechanism 447 or otherwise disposed below the viewport 463. Alternatively, the transmitter 451 may be disposed below the viewport 463, and the receiver 453 may be coupled to the lid 41. If a reflection-based system is employed, both the transmitter 451 and the receiver 453 may be coupled to the mounting mechanism 447 (or otherwise disposed below the viewport 463). In either case, because the transmitter 451 and the receiver 453 communicate through the inventive valve/sensor assembly 445, additional mounting locations and/or holes need not be machined within the bottom 43 of the transfer chamber 15 to allow the transmitter 451 and the receiver 453 to communicate. Note that more or fewer than two transmitters and receivers may be employed.

In operation, as the wafer W leaves the transfer chamber 15 (or as the wafer W re-enters the transfer chamber 15) from any of the various chambers coupled thereto, the wafer W breaks one or both of the light beams 467a–b. In response thereto, a signal (e.g., from the receiver 453) is communicated to the controller 449. The controller 449 then may compute the position of the wafer W on the wafer handler 19 using any conventional technique. For example, a position value may be computed for the wafer W and compared to a position value previously stored for a wafer properly positioned on the wafer handler 19. Based thereon, a wafer offset value may be calculated. If the wafer W is misaligned (e.g., if the position of the wafer W is off-center relative to a blade of the wafer handler 19), the wafer handler 19 may then center the wafer W relative to an opening (e.g., slit 47 in FIG. 1B) through which the wafer W is to travel or relative to a wafer support on which the wafer W is to be placed (e.g., using any conventional wafer-positioning technique).

As previously stated, any conventional door assembly may be configured with a sensor system in accordance with the present invention. Accordingly, exemplary, additional embodiments of the present invention are described further below.

First Conventional Vertical Door Assembly

Figure 5:
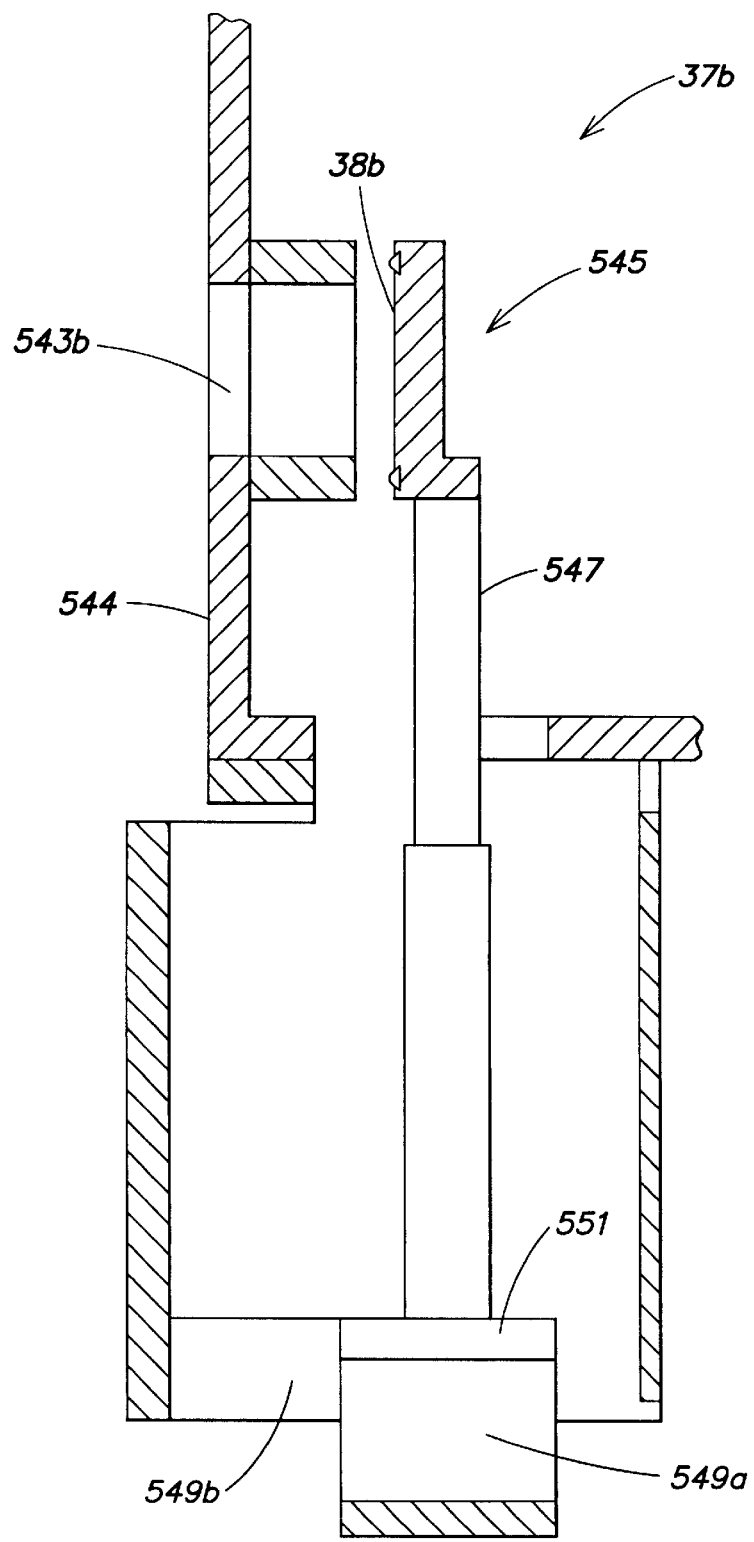
FIG. 5 is a schematic side elevational view of a conventional vertical door assembly.

FIG. 5 is a schematic side elevational view of a conventional vertical door assembly 37b. The vertical door assembly 37b includes a sealing surface 38b that moves up and down parallel to a surface 544 (e.g., a surface of the transfer chamber 15 of FIG. 1A or of a processing chamber) having a sealable opening 543b (e.g., slit 47 in FIG. 1B), rather than moving at a 45 degree angle as with the angled door assembly 37a of FIG. 2.

The vertical door assembly 37b may comprise a paddle-shaped structure 545, having the sealing surface 38b coupled to an elongated shaft portion 547 that extends downward from the sealing surface 38b. The vertical door assembly 37b also may comprise a first air cylinder 549a, coupled to a lower portion 551 of the paddle-shaped structure 545, that allows movement of the sealing surface 38b between a lowered position (not shown) wherein the vertical door assembly 37b does not occlude the opening 543b and an elevated position (FIG. 5) wherein the sealing surface 38b occludes the opening 543b. When the sealing surface 38b is in the elevated position (FIG. 5), upon actuation, a second air cylinder 549b pushes against the lower portion 551 so as to pivot the sealing surface 38b toward and into contact with the sealable opening 543b. The sealing surface 38b thereby seals the sealable opening 543b.

Second Inventive Valve/Sensor Assembly

Figure 6:
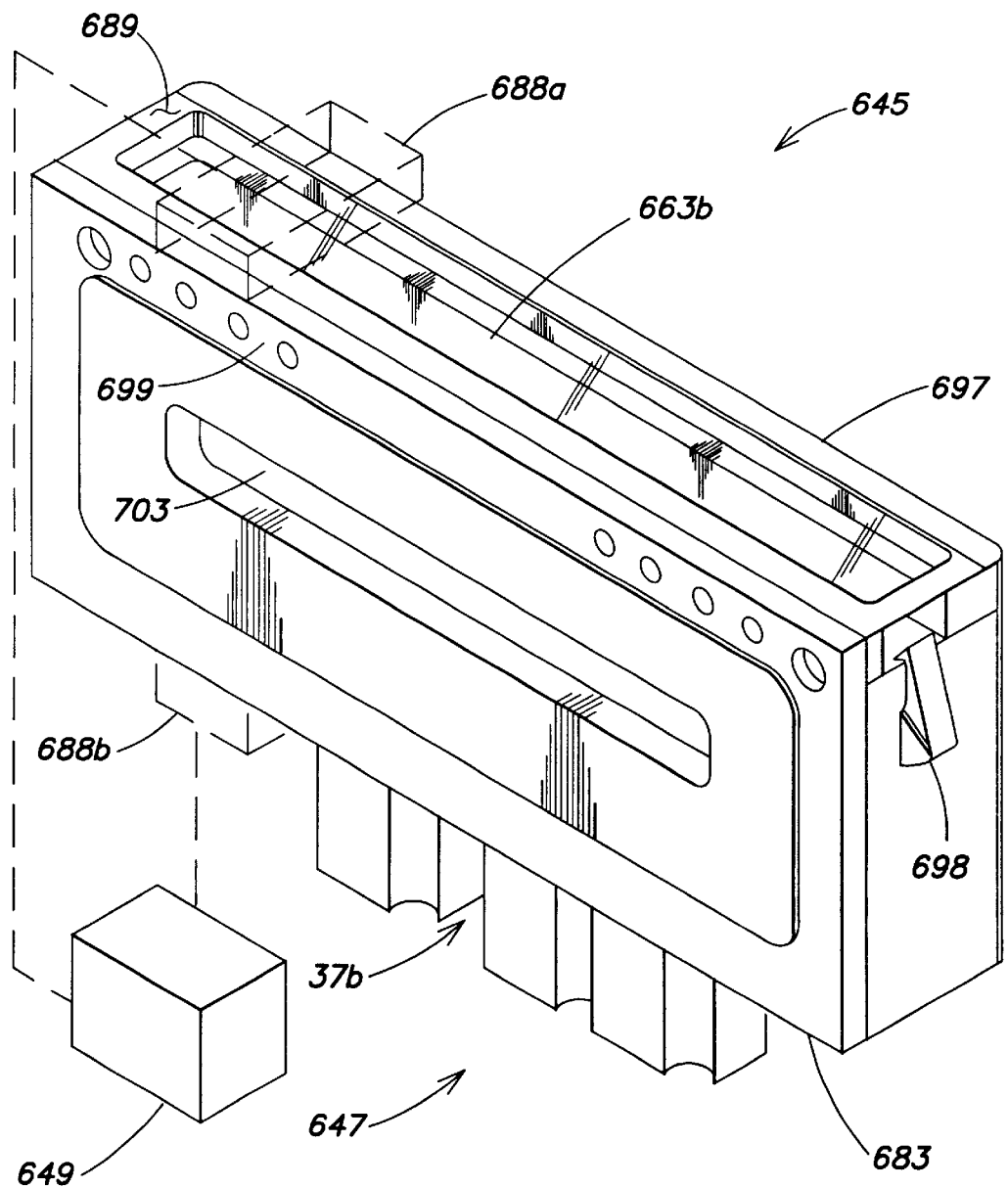
FIG. 6 is a side perspective view of a second inventive valve/sensor assembly.
Figure 7:
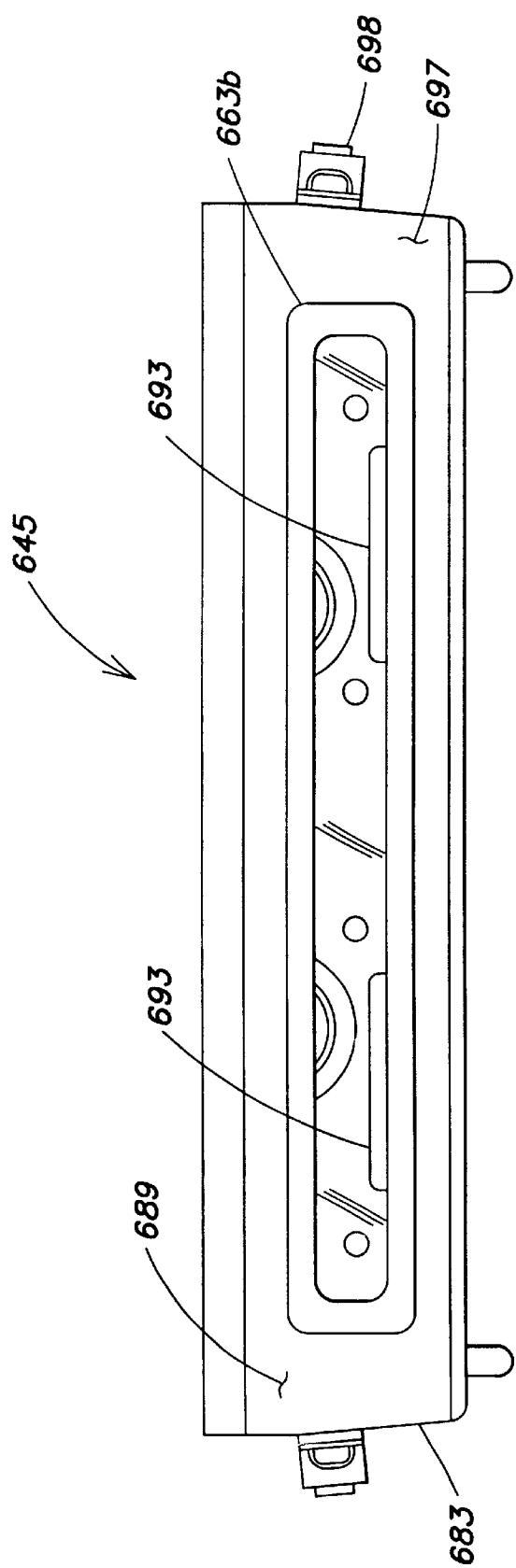
FIG. 7 is a top view of the second inventive valve/sensor assembly of FIG. 6.
Figure 8:
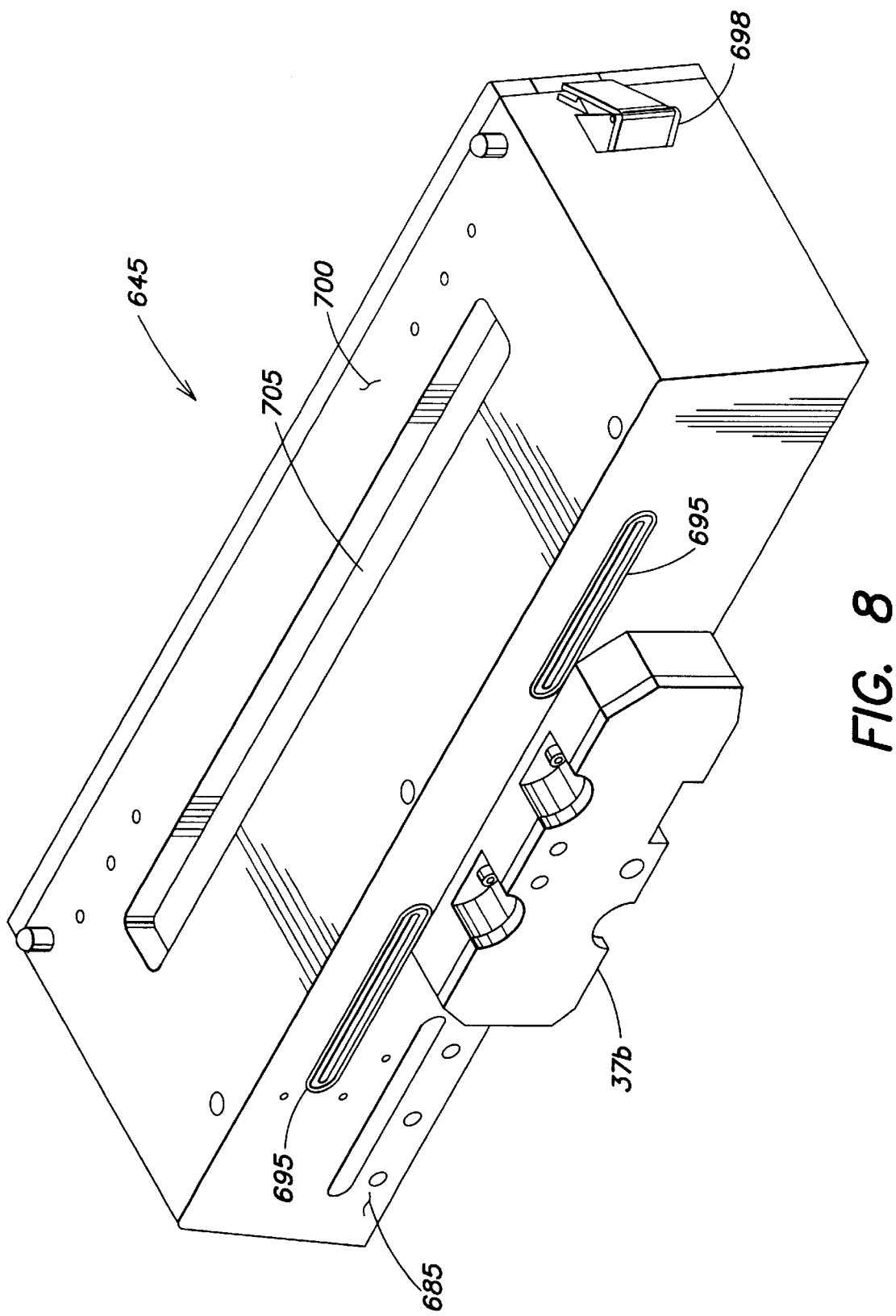
FIG. 8 is a bottom perspective view of the second inventive valve/sensor assembly of FIG. 6.
Figure 9:
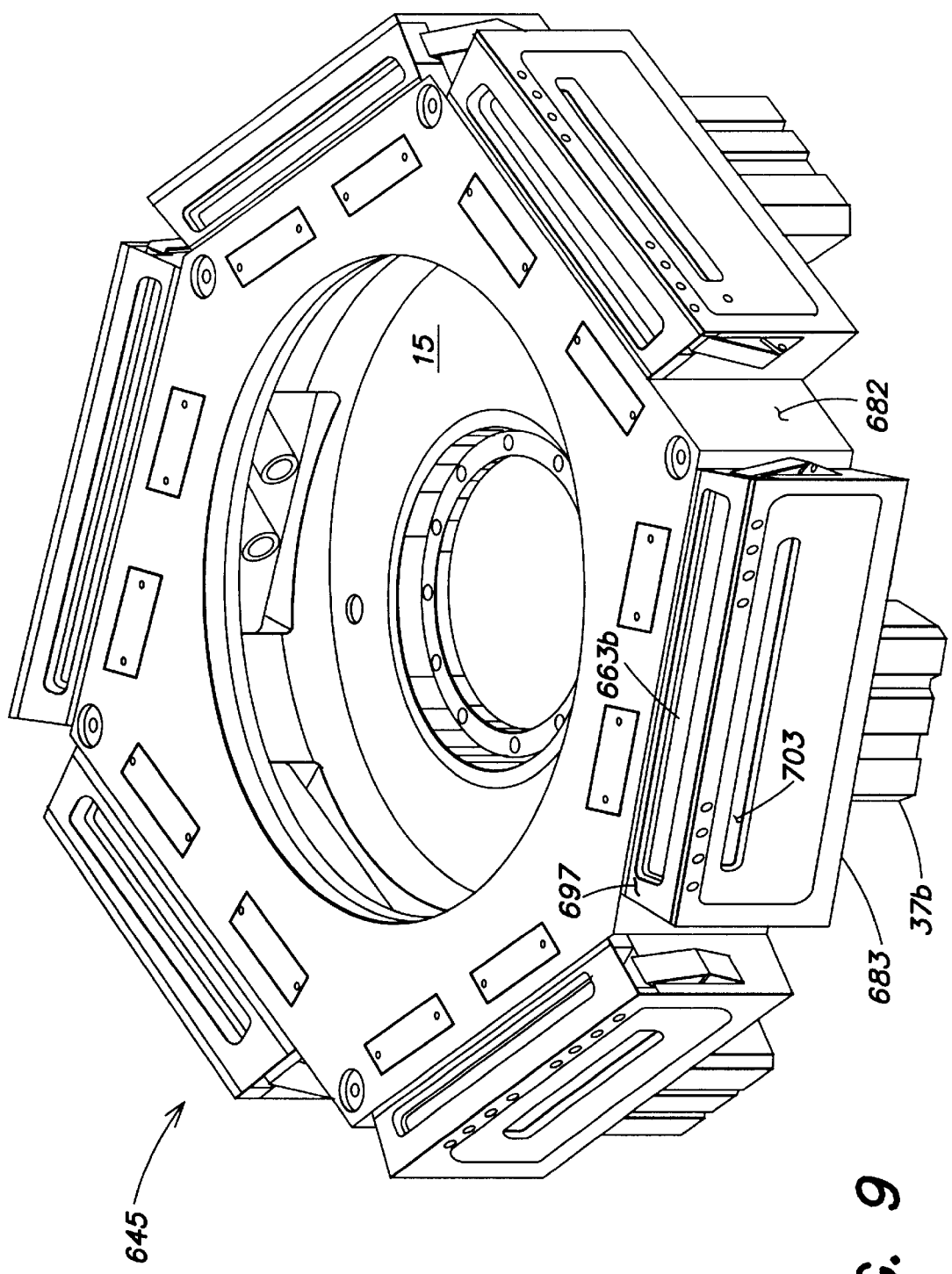
FIG. 9 is a perspective view of the second inventive valve/sensor assembly of FIG. 6 shown coupled to the transfer chamber of FIG. 1A.

FIGS. 6–9 show various views of a second inventive valve/sensor assembly 645 that employs the vertical door assembly 37b of FIG. 5. Specifically, FIG. 6 is a side perspective view of the second inventive valve/sensor assembly 645; FIG. 7 is a top view of the second inventive valve/sensor assembly 645; FIG. 8 is a bottom perspective view of the second inventive valve/sensor assembly 645; and FIG. 9 is a perspective view of the second inventive valve/sensor assembly 645 shown coupled to the transfer chamber 15.

The inventive valve/sensor assembly 645 may comprise a mounting mechanism 647, a sensor system 688 (represented by a transmitter 688a and a receiver 688b shown in phantom), and a controller 649 coupled to the sensor system 688. As with the sensor system 448 of the first inventive valve/sensor assembly 445, the sensor system 688 may detect the position of a wafer by using one or more of the previously described techniques, or one or more of the techniques described below with FIGS. 12–14. The controller 649 may receive a signal output by the sensor system 688 (e.g., a signal from the receiver 688b of the sensor system 688 that indicates when a light beam transmitted from the transmitter 688a to the receiver 688b has been blocked). The inventive valve/sensor assembly 645 may include multiple sensor systems 688, the transmitter 688a may include multiple light sources and/or the receiver 688b may include multiple light detectors. The locations of the transmitter 688a and the receiver 688b are merely exemplary.

In one embodiment, the mounting mechanism 647 may comprise a housing (e.g., a structure that may be inserted between a transfer chamber and another chamber, and that contains a conventional door assembly adapted to engage and seal a sealable opening such as the door assembly 37b of FIG. 5) that is coupled to a sidewall 682 (FIG. 9) of the transfer chamber 15, via bolts or some other fastener (not shown). The housing may comprise an adapter block 683 having an opening that may accommodate different wafer sizes and that may accommodate different sealing plate sizes.

In the embodiments of FIGS. 6–9, the adapter block 683 comprises a rectangular-shaped structure that has six sides. A bottom wall 685 (FIG. 8) has a region (not shown) that allows the vertical door assembly 37b of FIG. 5 to move up and down so as to selectively seal an opening of the transfer chamber 15, such as the slit 47 of FIG. 1B. A top wall 689 (FIG. 7) and the bottom wall 685 (FIG. 8) may have a top slot 693 (FIG. 7) and a bottom slot 695 (FIG. 8), respectively, such that the transmitter 688a and/or the receiver 688b may be inserted therein. For example, the light transmitter 688a may be inserted in the top slot 693 (FIG. 7), and the receiver 688b may be inserted in the bottom slot 695 (FIG. 8). For embodiments that employ reflection-based sensor systems (as described below with reference to FIG. 14), the top slot 693 or the bottom slot 695 may contain both the transmitter 688a and the receiver 688b. Both slots 693, 695 may contain a quartz window, such that each respective sensor may be isolated from processing tool environments.

The top wall 689 may comprise a viewport 663b (FIG. 7) and/or may comprise a removable lid 697 (FIG. 7), coupled to the remainder of the inventive valve/sensor assembly 645, via a latching mechanism 698 (FIG. 7). The viewport 663b (e.g., a quartz window) may provide unobstructed view of a wafer as the wafer passes through the inventive valve/sensor assembly 645. The removable lid 697 provides access into the adapter block 683 so as to allow repair of the vertical door assembly 37b or so as to allow cleaning of the adapter block 683 and/or the sensor system 688. A front wall 699 (FIG. 6) and a back wall 700 (FIG. 8) each have an aperture 703 (FIG. 6), 705 (FIG. 8) aligned so as to allow the wafer handler 19 and a wafer positioned thereon to pass through the adapter block 683 as the wafer handler 19 transports the wafer between the transfer chamber 15 and another chamber coupled thereto.

In operation, the wafer handler 19 transfers a wafer toward the sealable opening 543b (FIG. 5). As the wafer handler 19 approaches the sealable opening 543b, the vertical door assembly 37b, upon actuation, moves to a lowered position so as to allow a blade of the wafer handler 19 to extend through the opening 543b and through the adapter block 683. A wafer thereby may be transferred through the inventive valve/sensor assembly 645 and into another chamber.

Unlike the inventive valve/sensor assembly 445 of FIG. 4, which detects the position of a wafer while it is still within the transfer chamber 15, the inventive valve/sensor assembly 645 of FIGS. 6–9 detects the position of a wafer as the wafer passes through the adapter block 683 (e.g., using one or more of the previously described techniques, or one or more of the techniques described below with reference to FIGS. 12–14).

Because the exact locations of the light transmitter 688a and the receiver 688b are known relative to each other, the number of variables of the sensor system 688 is reduced, which may simplify the calibration requirements. Further, the modularity of the adapter block 683 allows the inventive valve/sensor assembly 645 to be easily replaced or repaired.

Although the inventive valve/sensor assembly 645 has been described with reference to the vertical door assembly 37b of FIG. 5, it will be understood that other door assemblies may be used in place of the vertical door assembly 37b, such as the vertical door assembly of FIG. 10 (described below).

Second Conventional Vertical Door Assembly

Figure 10:
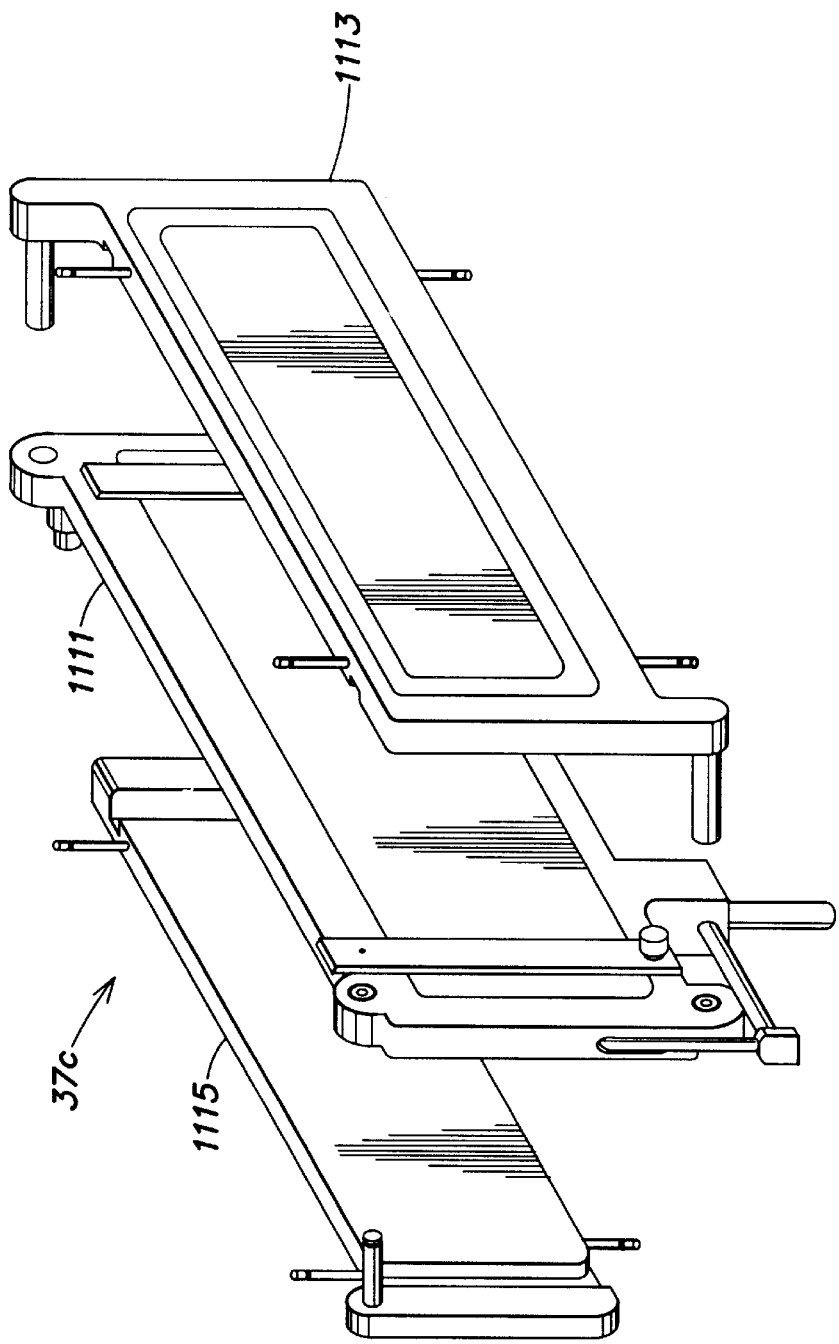
FIG. 10 is an exploded isometric view of an alternative, conventional vertical door assembly that may be used in place of the vertical door assembly of FIG. 5 within the inventive valve/sensor assembly of FIGS. 6–9.

FIG. 10 is an exploded isometric view of an alternative, conventional vertical door assembly 37c that may be used in place of the vertical door assembly 37b of FIG. 5 within the inventive valve/sensor assembly 645 of FIGS. 6–9. As stated, any other conventional vertical door assembly may be similarly employed.

With reference to FIG. 10, the vertical door assembly 37c employs at least one inflatable member 1111 adapted to selectively move a frontplate 1113 of the vertical door assembly 37c toward a sealable opening (not shown), such as the sealable opening 543b of FIG. 5. The vertical door assembly 37c also may include a backplate 1115 coupled to the frontplate 1113. The inflatable member 1111 is disposed between the frontplate 1113 and the backplate 1115 and is adapted to move the frontplate 1113 into sealing engagement with an opening of a chamber (e.g., the slit 47 of FIG. 1B) when inflated. The vertical door assembly 37c may be configured as described in U.S. patent application Ser. No. 09/238,251, filed Jan. 27, 1999 the entire disclosure of which is incorporated herein by this reference. The inventive valve/sensor assembly 645 operates similarly whether the door assembly 37b (FIG. 5) or the door assembly 37c (FIG. 10) is employed.

Conventional Arm of Wafer Handler

Figure 11:
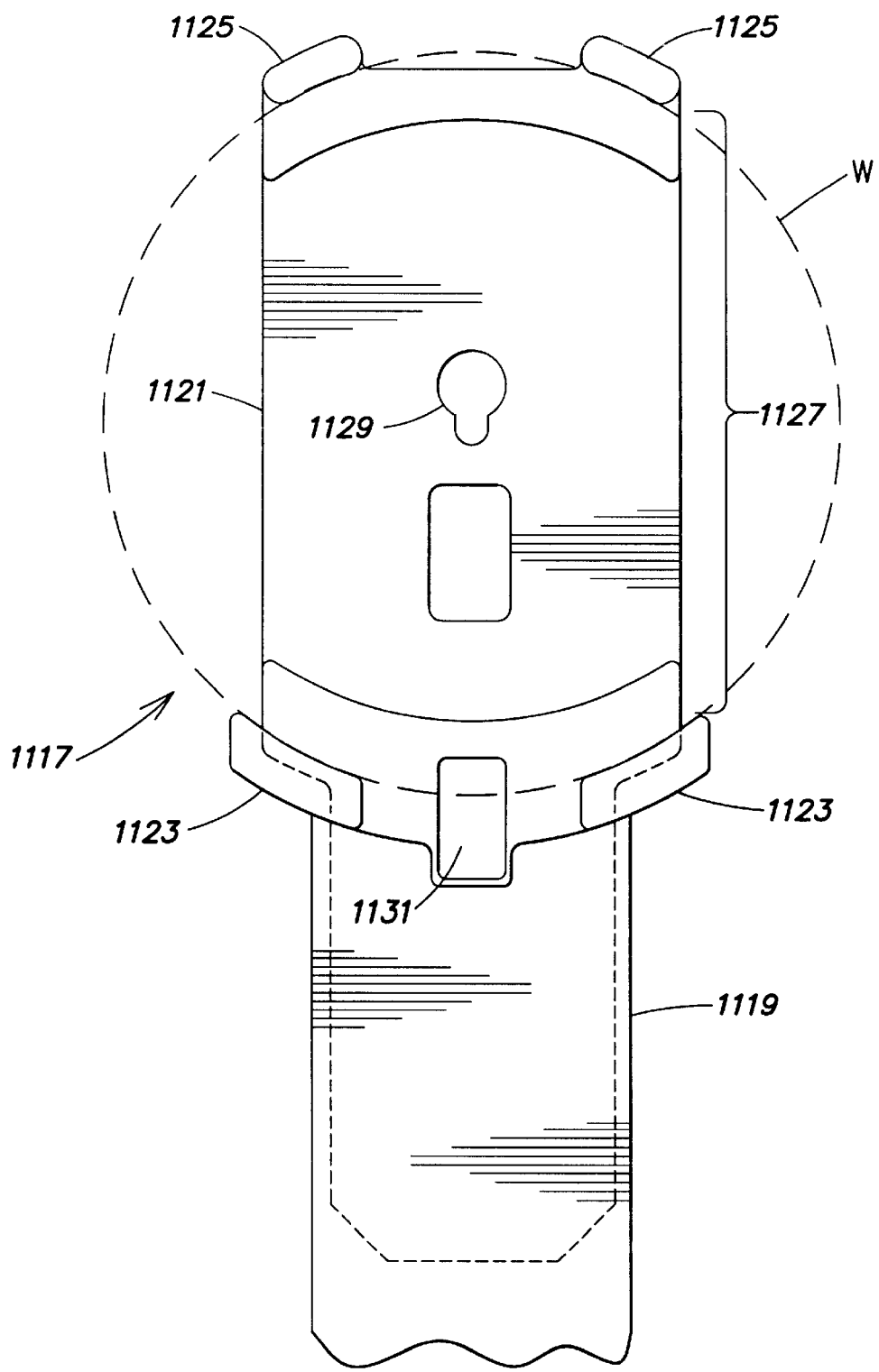
FIG. 11 is a schematic view of a conventional arm employable by the wafer handler of FIGS. 1A and 1B.

FIG. 11 is a schematic view of a conventional arm 1117 employable by the wafer handler 19 of FIGS. 1A and 1B. The arm 1117 may be employed during wafer positioning and/or centering in accordance with the present invention. Any other conventional wafer handler arm may be similarly employed.

With reference to FIG. 11, the arm 1117 may comprise a wrist 1119, a blade 1121 mounted to the wrist 1119, a pair of grippers 1123 positioned at the proximal end of the blade 1121, and a pair of projections or "shoes" 1125 positioned at the distal end of the blade 1121. The shoes 1125 and the grippers 1123 are positioned to form a pocket 1127 such that a wafer W (shown in phantom) may be inserted into the pocket 1127. The blade 1121 comprises a center hole 1129, which may be used to determine the presence of the wafer W on the blade 1121 as described below, and a slot 1131 positioned adjacent the grippers 1123, which may be used to determine the position of the wafer on the blade 1121 also as described below.

Upon actuation of a stepper motor (not shown), the grippers 1123, which are described in detail in U.S. Pat. No. 5,980,194, issued Nov. 9, 1999, the entire disclosure of which is incorporated herein by this reference, may retract away from the projections 1125 to enlarge the pocket 1127 as the wafer W is inserted onto the blade 1121. The grippers 1123 then may extend toward the projections 1125 to close the pocket 1127 after the wafer W is placed onto the blade 1121, thereby clamping the wafer W in the pocket 1127.

During operation of the wafer handler 19 (when the arm 1117 is employed) with the inventive valve/sensor assembly 445 of FIG. 4 (or the inventive valve/sensor assembly 645 of FIG. 6), the controller 449 (or the controller 649) may count the number of steps (e.g., of a stepper motor (not shown) that drives the wafer handler 19) that the wafer handler 19 has moved between one reference point (e.g., a point where the edge of the wafer W blocks a light beam from transmitter 451 or 688a from reaching receiver 453 or 688b) and another reference point (e.g., a point where the slot 1131 allows the light beam to pass therethrough and to the receiver 453 or 688b). The controller 449 (or the controller 649) then may derive an offset for proper positioning of the wafer W.

Positioning techniques may function by using the following general process. First, the sensor system 448, 688 is calibrated by collecting data from a wafer that is properly positioned on the blade 1121. Then, to determine the position of a wafer being processed in the tool 11 (FIG. 1A), positional points are collected when an edge of the slot 1131 crosses a light beam (from transmitter 451 or 688a) and when an edge of the wafer crosses the light beam. The positional points are compared to the calibration data to calculate a wafer offset value. From the wafer offset value, the wafer handler 19 may center the wafer on a substrate support (not shown) of another chamber (e.g., one of the processing chambers 29–35 of FIG. 1A) by adjusting the position of the blade 1121 relative to the substrate support (such that the wafer is centered above the wafer support).

Exemplary Through-Beam Sensor System

Figure 12:
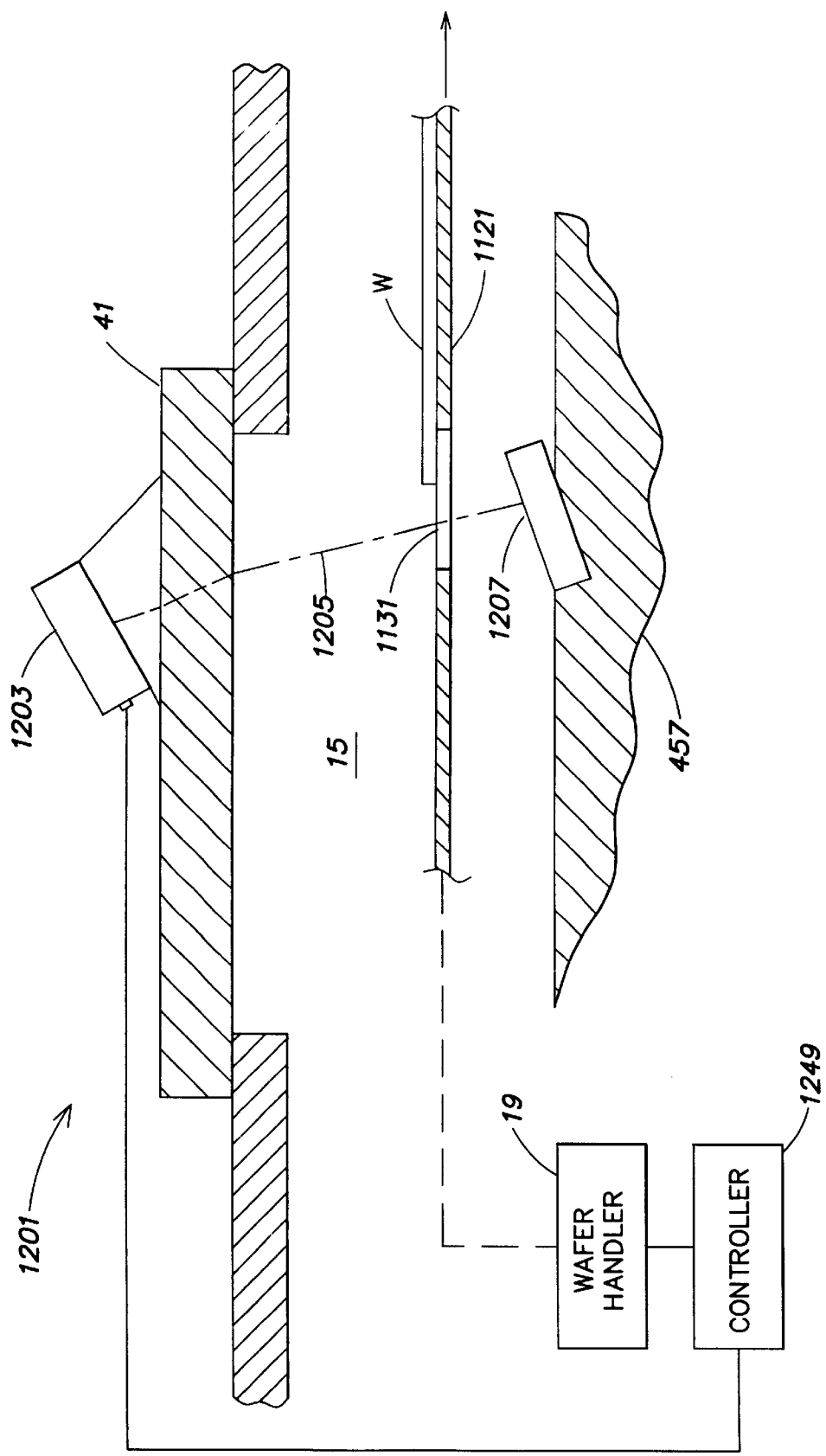
FIG. 12 is a side view of an exemplary through-beam sensor system that may determine a wafer's position on the blade of FIG. 11 of the wafer handler of FIG. 1A.

FIG. 12 is a side view of an exemplary through-beam sensor system 1201 that may determine a wafer's position on the blade 1121 (FIG. 11) of the wafer handler 19 (FIG. 1A). A similar through-beam sensor system may be employed with the inventive valve/sensor assemblies 445, 645. With reference to FIG. 12, the through-beam sensor system 1201 comprises a transmitter 1203 positioned so as to transmit a light beam 1205 to a receiver 1207 "through" a path traveled by the wafer handler 19 as the wafer handler 19 transports a wafer W. The transmitter 1203 may be positioned, for example, on the lid 41 of the transfer chamber 15, and the receiver 1207 may be coupled to the mounting plate 457 of the inventive valve/sensor assembly 445. Other locations may be similarly employed. As described further below, when the wafer W is positioned between the transmitter 1203 and the receiver 1207, the wafer W blocks the light beam 1205 emitted by the transmitter 1203, and the receiver 1207 does not detect the light beam 1205. When the wafer W is not positioned between the transmitter 1203 and the receiver 1207, the receiver 1207 detects the light beam 1205.

Exemplary Process for Through-Beam Sensor System

Figure 13A:
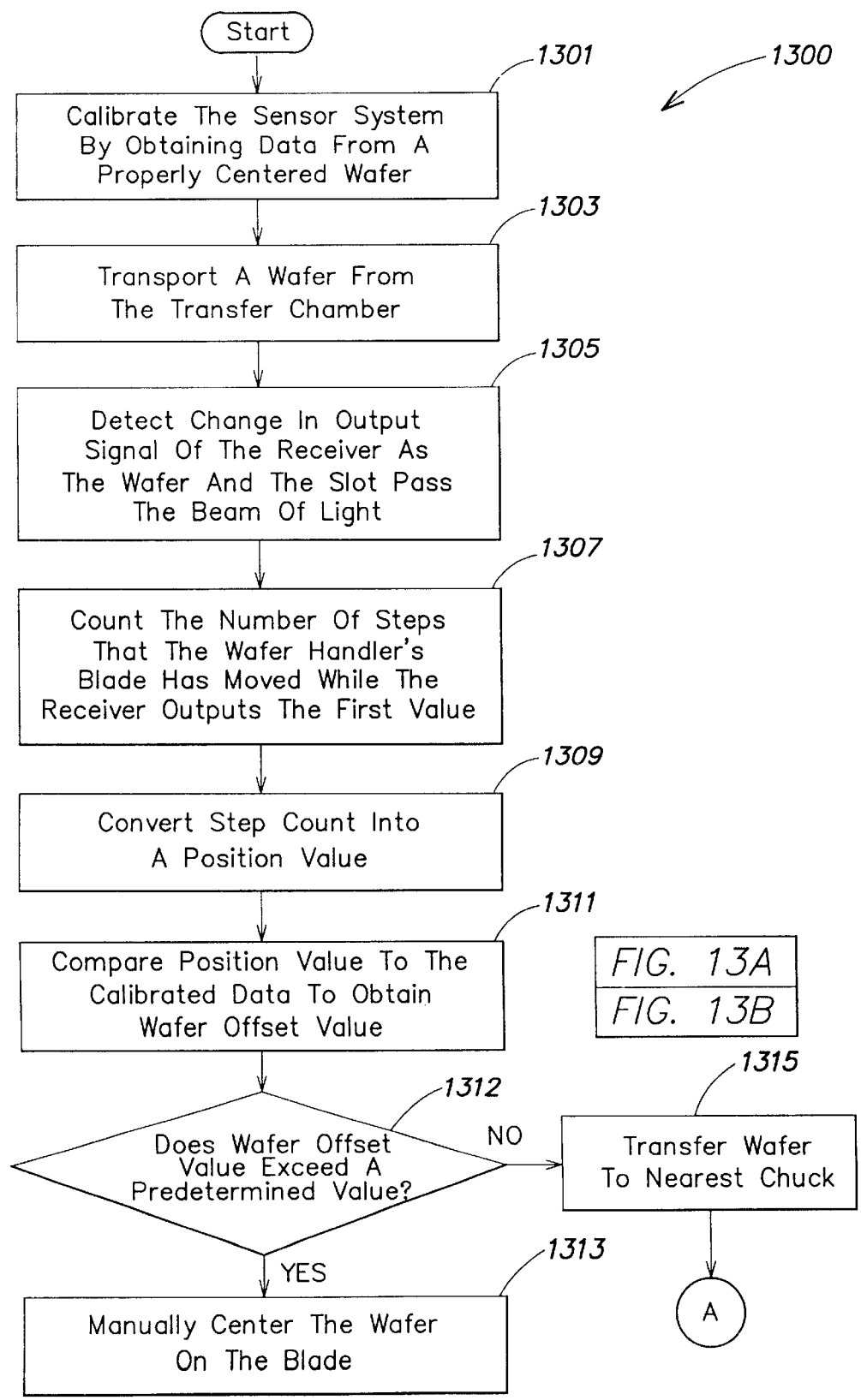
FIG. 13 is a flowchart of an exemplary process for determining a wafer's position on a wafer handler using the through-beam sensor system of FIG. 12.
Figure 13B:
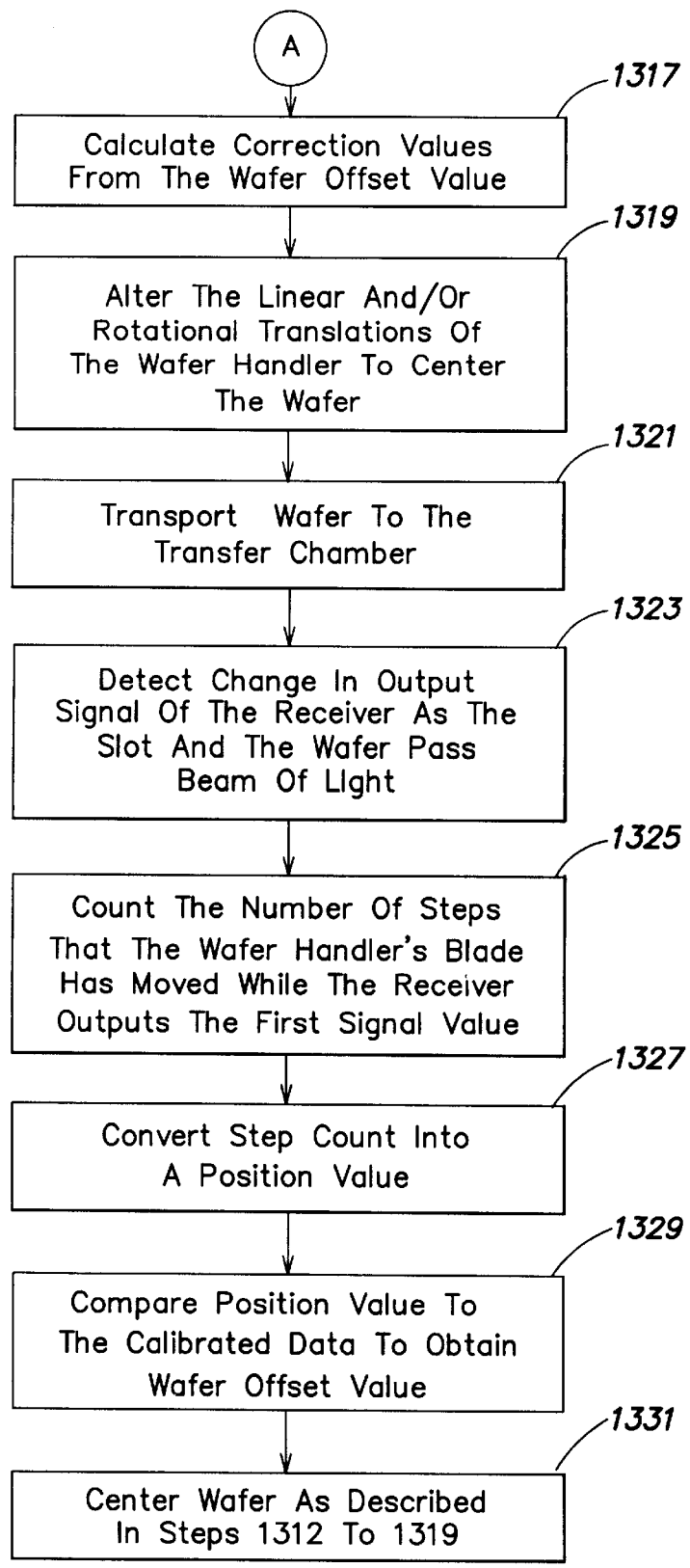

FIG. 13 is a flowchart of an exemplary process 1300 for determining a wafer's position on the wafer handler 19 using the through-beam sensor system 1201 of FIG. 12. Other processes may be similarly performed.

Referring to FIG. 13, in step 1301, the sensor system 1201 is calibrated by collecting data from a wafer that is properly centered on the blade 1121 of the wafer handler 19 as the wafer travels between the transmitter 1203 and the receiver 1207. The data may include, for example, (1) a measured distance between a trailing edge of the properly centered wafer and a trailing edge of the slot 1131; (2) the size of the wafer (e.g., 5, 6, or 8 inch); (3) a measured distance between two or more reference points, as the wafer handler 19 transports the properly centered wafer; (4) a measured distance between the leading and the trailing edges of the slot 1131; (5) the location of the transmitter 1203 and the receiver 1207; and (6) the speed at which the blade 1121 of the wafer handler 19 travels. The data is stored and is used to determine a wafer offset value of a wafer W (e.g., a subsequent, not necessarily properly centered wafer) that is transported by the wafer handler 19 as described below. The data may be stored, for example, in a controller 1249 (FIG. 12), the controller 449 (FIG. 4), the controller 649 (FIG. 6) or the like.

In step 1303, the wafer handler 19 transports the wafer W from the transfer chamber 15 to one of the various chambers coupled to the transfer chamber 15 (e.g., one of the processing chambers 29–35). As the wafer handler 19 transports the wafer W from the transfer chamber 15 to another chamber, the leading edge of the wafer W (the distal edge of the wafer W on the blade 1121) blocks the light beam 1205 from the transmitter 1203 so that the receiver 1207 does not detect the light beam 1205. After the wafer W passes the light beam 1205, the slot 1131 allows the light beam 1205 to pass through the wafer handler 19 so as to contact the receiver 1207.

In step 1305, the change in the amount of light detected by the receiver 1207 between when the wafer W interrupts the light beam 1205 and when the slot 1131 allows the light beam 1205 to pass through the wafer handler 19 is determined. Note that an output of the receiver 1207 may have a first signal value when the light beam 1205 contacts the receiver 1207 (e.g., a non-interrupted state such as when the light beam 1205 passes through the slot 1131), and may have a second signal value when the light beam 1205 does not contact the receiver 1207 (e.g., an interrupted state such as when the light beam 1205 strikes the wafer W).

The output signal of the receiver 1207 thus changes from the first signal value to the second signal value when the light beam 1205 (which strikes the receiver 1207 before the wafer handler 19 crosses the path of the light beam) becomes blocked by the leading edge of the wafer W. After the trailing edge of the wafer W passes the light beam 1205, the output signal of the receiver 1207 changes from the second signal value to the first signal value when the light beam 1205 passes through the slot 1131. After the trailing edge of the slot 1131 passes the light beam 1205, the output signal of the receiver 1207 changes from the first signal value back to the second signal value.

In step 1307, the controller 1249 counts the number of steps that the blade 1121 of the wafer handler 19 has moved between when the output signal of the receiver 1207 changes from the second signal value (interrupted state) to the first signal value (non-interrupted state) and back to the second signal value (interrupted state) (e.g., the time period during which the receiver 1207 outputs the first signal value). The controller 1249 converts the step count into a position value in step 1309 (e.g., by means of lookup table that stores the calibrated values previously described). Then, in step 1311, the position value is compared to the calibrated data to calculate a wafer offset value. Specifically, an exact match between the position value for the wafer W and the position value previously stored for the properly centered wafer (step 1301) represents a centered wafer. If the position value for the wafer W differs from the position value previously stored for the properly centered wafer, then the wafer W is not properly centered.

In step 1312, the wafer offset value is compared to a predetermined value. If the wafer offset value is greater than the predetermined value, in step 1313, the controller 1249 may stop the wafer handler 19 so that an operator may manually center the wafer W on the blade 1121 (and the process 1300 may end); otherwise, in step 1315, if the wafer offset value does not exceed the predetermined value, then wafer transfer continues as described below.

Following step 1315, in step 1317, the controller 1249 calculates correction values for the wafer handler 19 from the wafer offset value. Based on the correction values, the controller 1249 alters the linear and/or rotational translations of the wafer handler 19 so as to adjust for wafer misalignment and to center the wafer W (step 1319). The wafer W also may be centered using the technique described in U.S. Pat. No. 5,563,798, issued October, 1996, the entire disclosure of which is incorporated herein by this reference. Assuming the wafer handler 19 transports the wafer W from the transfer chamber to the processing chamber 29, the wafer W may be placed on (e.g., centered on) a substrate support (not shown) of the processing chamber 29 and processed.

In step 1321, the wafer handler 19 transports the wafer W from a chamber coupled to the transfer chamber 15 (e.g., one of the processing chambers 29–35 of FIG. 1A) to the transfer chamber 15. As the wafer handler 19 transports the wafer W to the transfer chamber 15, the slot 1131 allows the light beam 1205 to pass through the wafer handler 19 so as to contact the receiver 1207. After the slot 1131 passes the light beam 1205, the leading edge of the wafer W blocks the light beam 1205.

In step 1323, the change in the output signal of the receiver 1207 between when the slot 1131 allows the light beam 1205 to pass through the wafer handler 19 and when the leading edge of the wafer W interrupts the light beam 1205 is determined. When the slot 1131 allows the light beam 1205 to pass, the output signal of the receiver 1207 is the first signal value. When the leading edge of the wafer W interrupts the light beam 1205, the output signal of the receiver 1207 is the second signal value.

The output signal of the receiver 1207 changes from the first signal value to the second signal value when the light beam 1205 traveling through the slot 1131 becomes blocked by the leading edge of the wafer W. In step 1325, the controller 1249 counts the number of steps that the wafer handler 19 has moved while the light beam 1205 passes through the slot 1131 (e.g., the time period during which the receiver 1207 outputs the first signal value). The controller 1249 converts the step count into a position value in step 1327. Then, in step 1329, the position value is compared to the calibrated data to calculate the wafer offset value. Thereafter, in step 1331, the wafer W is centered as described above with reference to steps 1312–1319. The process 1300 then ends.

As stated previously, the inventive valve/sensor assembly 445 of FIG. 4, the inventive valve/sensor assembly 645 of FIG. 6 or any other valve/sensor assembly configured in accordance with the present invention may employ the process 1300 or a variation thereof. The controller 449, 649 and/or 1249 may comprise computer program code for performing one or more of the steps of the process 1300 and may include one or more computer program products.

Exemplary Reflection-Based Sensor System

Figure 14:
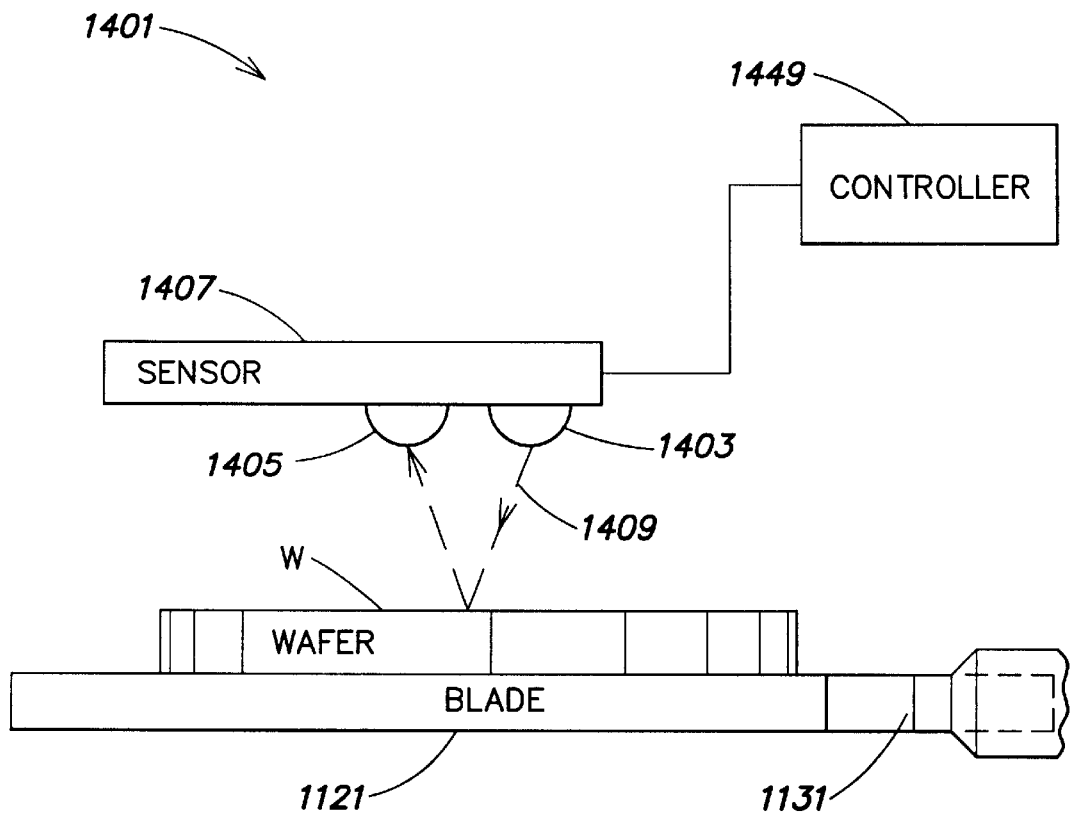
FIG. 14 is a partial side view of an exemplary reflection-based sensor system that may determine a wafer's position on the blade of FIG. 11 of the wafer handler of FIG. 1A.

FIG. 14 is a partial side view of an exemplary reflection-based sensor system 1401 that may determine a wafer's position on the blade 1121 (FIG. 11) of the wafer handler 19 (FIG. 1A). A similar reflection-based sensor system may be employed with the inventive valve/sensor assemblies 445, 645 or any other valve/sensor assembly configured in accordance with the present invention.

With reference to FIG. 14, the refection-based sensor system 1401 comprises a transmitter 1403 and a receiver 1405, which may or may not be contained within a single housing 1407. The transmitter 1403 and the receiver 1405 may be located in, for example, the top slot 693 of the inventive valve/sensor assembly 645 (FIG. 7). The receiver 1405 may detect a light beam 1409 (transmitted by the transmitter 1403) that reflects off of the wafer W, to indicate wafer presence (rather than detect a light beam that passes between a light transmitter and a receiver to indicate wafer absence as with the through-beam sensor 1201 of FIG. 12).

Thus, for the reflection-based sensor system 1401, the change in the output signal of the receiver 1405 is measured when the slot 1131 allows the light beam 1409 to pass therethrough as compared to when the wafer W reflects the light beam 1409 toward the receiver 1405. When the light beam 1409 passes through the slot 1131, the output signal of the receiver 1405 has a first signal value (interrupted state). When the wafer W reflects the light beam 1409, the output signal of the receiver 1405 has a second signal value (non-interrupted state). The change in the output signal of the receiver 1405 may be used for wafer positioning in a manner similar to that of process 1300 (FIG. 13).

Both the through-beam sensor system 1201 (FIGS. 12–13) and the reflection-based sensor system 1401 (FIG. 14) may determine whether the wafer W is present on the blade 1121. As the wafer handler 19 passes through the sensor system 1201, 1401, the light beam 1205, 1409 may pass through the center hole 1129 (FIG. 11) of the blade 1121 if the wafer W is not present on the blade 1121. Otherwise, if the wafer W is present on the blade 1121, the wafer W blocks the light beam 1205, 1409. Detection of the leading or trailing edge of the wafer W similarly may indicate wafer presence. The light beam 1205, 1409 may be projected at an angle relative to either the lid 41 of the transfer chamber 15 or the top slot 693 of the inventive valve/sensor assembly 645. The angled light beam may reduce the possibility that the receiver 1207, 1405 will detect other sources of light.

The foregoing description discloses only exemplary embodiments of the invention. Modifications of the above-disclosed apparatus and method which fall within the scope of the invention will be readily apparent to those of ordinary skill in the art. As previously described, the inventive valve/sensor assembly 445, 645 may be employed with any conventional door assembly, may include the use of a reflector as described in U.S. Pat. No. 5,980,194, and may center a wafer using any conventional wafer-positioning technique.

While the inventive valve/sensor assemblies of the present invention have been described primarily with reference to the fabrication tool 11 and the transfer chamber 15 (FIG. 1A), it will be understood that the transfer chamber 13 or any other chamber or fabrication tool may be similarly configured.

Accordingly, while the present invention has been disclosed in connection with exemplary embodiments thereof, it should be understood that other embodiments may fall within the spirit and scope of the invention, as defined by the following claims.

The invention claimed is:

1. A valve/sensor assembly comprising:
   a door assembly having:
      a first position adapted to seal an opening of a chamber;
      a second position adapted to allow at least a blade of a substrate handler to extend through the opening of the chamber; and
   a mounting mechanism adapted to couple the door assembly to the chamber; and
   a sensor system having a transmitter and a receiver adapted to detect a presence of a substrate and to communicate through at least a portion of the door assembly.

2. The valve/sensor assembly of claim 1 wherein the opening is a slit of the chamber.

3. The valve/sensor assembly of claim 2 wherein the opening is a slit of a transfer chamber.

4. The valve/sensor assembly of claim 1 wherein the mounting mechanism is adapted to couple to a bottom of the chamber.

5. The valve/sensor assembly of claim 1 wherein the mounting mechanism is adapted to couple to the chamber so as to cover the opening.

6. The valve/sensor assembly of claim 1 wherein the mounting mechanism includes a viewport that allows the transmitter and receiver to communicate through the mounting mechanism.

7. The valve/sensor assembly of claim 6 wherein the transmitter is adapted to transmit a light beam and wherein the receiver is adapted to receive and detect the light beam.

8. The valve/sensor assembly of claim 1 wherein the door assembly comprises an angled door assembly having a sealing surface that moves at an angle.

9. The valve/sensor assembly of claim 1 wherein the door assembly comprises a vertical door assembly having a sealing surface that moves substantially vertically.

10. The valve/sensor assembly of claim 9 wherein the mounting mechanism houses the sealing surface.

11. The valve/sensor assembly of claim 9 wherein the mounting mechanism comprises a location adapted to store at least one of the transmitter and the receiver.

12. The valve/sensor assembly of claim 9 wherein the mounting mechanism comprises a location adapted to store both the transmitter and the receiver.

13. The valve/sensor assembly of claim 1 wherein the transmitter is adapted to transmit a light beam and wherein the receiver is adapted to receive and detect the light beam.

14. The valve/sensor assembly of claim 13 wherein the receiver is located so as to receive the light beam when the light beam is not blocked by a substrate.

15. The valve/sensor assembly of claim 13 wherein the receiver is located so as to receive the light beam when the light beam is reflected from a substrate.

16. The valve/sensor assembly of claim 1 wherein at least one of the transmitter and the receiver is coupled to the mounting mechanism.

17. The valve/sensor assembly of claim 1 further comprising a controller coupled to the receiver, the controller having computer program code adapted to detect a presence of a substrate on a substrate handler disposed within the chamber and to determine whether the substrate is centered on a blade of the substrate handler.

18. The valve/sensor assembly of claim 17 wherein the controller further comprises computer program code adapted to adjust placement of the substrate one a substrate pedestal if the substrate is not centered on the blade of the substrate handler.

19. A system comprising:
   a chamber having an opening;
   a valve/sensor assembly coupled to the chamber, the valve/sensor assembly comprising:
      a door assembly having:
         a first position adapted to seal the opening of the chamber;

a second position adapted to allow at least a blade of a substrate handler to extend through the opening of the chamber; and a mounting mechanism coupled to the chamber; and a sensor system having a transmitter and a receiver adapted to detect a presence of a substrate and to communicate through at least a portion of the door assembly; and a controller coupled to the receiver, the controller having computer program code adapted to detect a presence of a substrate on a substrate handler and to determine whether the substrate is centered on a blade of the substrate handler.

20. A valve/sensor assembly comprising:

a door assembly having:

a first position adapted to seal an opening of a chamber;

a second position adapted to allow at least a blade of a substrate handler to extend through the opening of the chamber; and a mounting mechanism adapted to couple the door assembly to the chamber, the mounting mechanism having a viewport; and a sensor system having a transmitter and a receiver adapted to detect a presence of a substrate and to communicate through the viewport of the mounting mechanism.

21. A system comprising:

a chamber having an opening;

a valve/sensor assembly coupled to the chamber, the valve/sensor assembly comprising:

a door assembly having:

a first position adapted to seal the opening of the chamber;

a second position adapted to allow at least a blade of a substrate handler to extend through the opening of the chamber; and a mounting mechanism coupled to the chamber, the mounting mechanism having a viewport; and a sensor system having a transmitter and a receiver adapted to detect a presence of a substrate and to communicate through the viewport of the mounting mechanism; and a controller coupled to the receiver, the controller having computer program code adapted to detect a presence of a substrate on a substrate handler and to determine whether the substrate is centered on a blade of the substrate handler.

* * * * *